United States Patent [19]
Peidous

[11] Patent Number: 6,001,700
[45] Date of Patent: Dec. 14, 1999

[54] METHOD AND MASK STRUCTURE FOR SELF-ALIGNING ION IMPLANTING TO FORM VARIOUS DEVICE STRUCTURES

[75] Inventor: Igor V. Peidous, Singapore, Singapore

[73] Assignee: Chartered Semiconductor Manufacturing Ltd., Singapore, Singapore

[21] Appl. No.: 09/166,394

[22] Filed: Oct. 5, 1998

Related U.S. Application Data

[62] Division of application No. 08/956,970, Oct. 23, 1997, Pat. No. 5,849,613.

[51] Int. Cl.⁶ .................................................. H01L 21/331
[52] U.S. Cl. .......................... 438/309; 438/362; 438/364; 438/377
[58] Field of Search ..................... 438/320, 309, 438/353, 362, 322, 364, 377, 439

[56] References Cited

U.S. PATENT DOCUMENTS

| | | | |
|---|---|---|---|
| 4,325,180 | 4/1982 | Curran | 438/234 |
| 5,254,486 | 10/1993 | Alter | 438/327 |
| 5,364,800 | 11/1994 | Joyner . | |
| 5,393,677 | 2/1995 | Lien et al. | 438/207 |
| 5,548,149 | 8/1996 | Joyner | 257/347 |
| 5,693,543 | 12/1997 | Yoshihisa et al. | 438/325 |

Primary Examiner—Tuan H. Nguyen
Attorney, Agent, or Firm—George O. Saile; Rosemary L.S. Pike

[57] ABSTRACT

A method for making self-aligned sub-micrometer bipolar transistors and FETs on a substrate for BiFET and BiCMOS circuits was achieved using a novel LOCOS structure as a self-aligned implant mask. This LOCOS structure uses a silicon nitride mask comprised of stripes with well defined widths and spacings to form a punchthrough oxide mask of varying thicknesses over the emitter, base, and collector of the bipolar transistor, while providing a thick field oxide elsewhere on the substrate. The oxide mask serves as a self-aligned implant mask for implanting the emitter, base, and collector of the bipolar transistor. The nitride mask can be patterned concurrently to form an implant mask for the FET. A series of ion implants is then used to form the emitter, base, and collector without requiring separate photoresist masks. An array of nitride stripes with well defined widths and spacings can be used to make larger transistors, such as bipolar power transistors. The method for simultaneously forming the bipolar and FET minimizes the thermal budget, and the collector implant can be adjusted to minimize the collector contact resistance. The partially recessed punchthrough oxide around the emitter region reduces the base current, and therefore improves the base transport factor (gain) of the bipolar transistor.

7 Claims, 9 Drawing Sheets

METHOD AND MASK STRUCTURE FOR SELF-ALIGNING ION IMPLANTING TO FORM VARIOUS DEVICE STRUCTURES

This is a division of patent application Ser. No. 08/956,970, now U.S. Pat. No. 5,849,613, filing date Oct. 23, 1997, A Method And Mask Structure For Self-Aligning Ion Implanting To Form Various Device Structures, assigned to the same assignee as the present invention.

BACKGROUND OF THE INVENTION (1) Field of the Invention

The present invention relates to the fabrication of integrated circuit devices on semiconductor substrates, and more particularly relates to a method for making bipolar and MOS devices using variations in the punchthrough and field oxide (FOX) thickness formed by the LOCal Oxidation of Silicon (LOCOS) method. The multiple thickness of the LOCOS is used as a self-aligning implant mask, and to electrically isolate the device areas. This eliminates the multiphotoresist masking steps for ion implantation and the accompanying alignment tolerance limitations, thereby providing high device-packing density and a cost-effective manufacturing process.

(2) Description of the Prior Art

Typically the fabrication of bipolar and MOS transistors requires a considerable number of processing steps. Because of their vertical structure, bipolar transistors require a series of separate implant masks and ion implant steps for making the emitter, base, and collector. This is because the bipolar requires multiple masking and implant steps to form the collector, base, and emitter at different depths in the silicon substrate. On the other hand, the FETs, such as used on dynamic random access memory (DRAM) circuits are basically surface devices that are simpler to fabricate, and can have improved device characteristics by including a doped shield region under the FET source, which can increase driver current and increase breakdown voltage between source and drain. However, an additional masking step is required to implant the shield region under the FET source. Therefore, it is desirable to be able to fabricate the bipolar and/or field effect transistors with reduced complexity. It is also desirable to provide a single self-aligning implant mask to decrease device size and to increase device-packing density, which would not be achieved otherwise by the conventional method in which separate lithographic masking and alignment tolerances limit device size.

One method of using a screen oxide layer having various thicknesses to form devices at various depths in the substrate is described by Joyner, U.S. Pat. Nos. 5,364,800 and 5,548,149. Joyner teaches a method of patterning a screen oxide implant layer having different thickness which he then uses to implant oxygen to form silicon-on-insulator (SOI) substrates having silicon device areas of various depths.

Therefore, there is still a strong need in the semiconductor industry to make circuits with improved self-aligned semiconductor devices for improved density and circuit performance while reducing manufacturing cost.

SUMMARY OF THE INVENTION

It is therefore a principal object of this invention to form a self-aligned ion implantation mask for semiconductor devices using a novel LOCOS method.

It is another object of this invention to use this novel LOCOS method to make a self-aligned multiple thickness silicon oxide ion implant mask for forming bipolar transistors and/or FETs, while forming the field oxide isolation, and therefore reducing the number of photoresist ion implant masking steps.

A further object of this invention is to provide a self-aligned multiple thickness ion implant mask that also reduces the size of the devices resulting in higher circuit density and improved circuit performance.

It is also an object of this invention to form bipolar and FET transistors using an array of silicon nitride stripes and the novel LOCOS method to make bipolar power transistors and FETs having variable sizes on the same substrate.

In accordance with the objects of the invention, a novel LOCOS method is used to fabricate bipolar and/or field effect transistors by forming a self-aligned silicon oxide implant mask. The oxide implant mask is formed having a different oxide thickness over each region of the bipolar, such as base, collector, and emitter, and for FET devices over the source and gate/drain regions. This eliminates the need for multiple photoresist masking steps as used in the conventional method. The silicon oxide mask also remains on the substrate to serve as part of the structure and to electrically insulate the silicon devices from the next level of electrical interconnections.

These bipolar transistors or FETs are built in and on a single-crystal semiconductor substrate that is doped with a P-type dopant, such as boron. However, silicon substrates having doped P- and N-wells can also be used to make CMOS devices for fabricating BiCMOS circuits. The method utilizes both a single silicon nitride stripe having varying well defined widths to make an oxidation barrier mask for making submicrometer bipolar transistors, and an array of silicon nitride stripes having various well defined widths and spacings on the silicon substrate for making larger power transistors. Continuing with the process, a thermal oxidation is carried out to form a field oxide (FOX) around the silicon nitride stripes, while this thermal oxidation also laterally oxidizes the silicon substrate under the silicon nitride stripes (mask) to form the ion implant mask of various thicknesses. The lateral oxidation is commonly referred to as the punchthrough oxide when it extends completely under the silicon nitride stripes.

This novel LOCOS method and resulting structure starts by forming a pad oxide layer on the silicon substrate surface by thermal oxidation. A chemical vapor deposited (CVD) silicon nitride layer is deposited on the pad oxide layer to provide an oxidation barrier layer when the thermal oxidation is later carried out to form the field oxide (FOX). The silicon nitride layer is then patterned using photolithographic techniques and anisotropic plasma etching to form a single silicon nitride stripe over each device area having varying decreasing widths for emitter, base, and collector regions, respectively, for the bipolar transistors. The silicon nitride layer can also be patterned over other device areas for FETs having silicon nitride stripes of decreasing widths. A wide silicon nitride area is formed over the FET source area to prevent punchthrough oxide from forming, while a silicon nitride stripe having a narrower width is formed over the gate electrode/drain area to provide a punchthrough oxide mask, as an implant block-out mask, over the gate electrode/drain area.

The silicon substrate is then thermally oxidized to form the field oxide isolation around the device areas that have the silicon nitride stripes, and concurrently and laterally oxidizes the substrate under the silicon nitride stripes to form the punchthrough oxide which later serves as a self-aligned oxide implant mask. For the bipolar transistors, the oxide implant mask over the collector resulting from the punchthrough oxidation is thinner than the field oxide region, while the oxide implant mask over the base region is thinner than the oxide implant mask over the collector region. And further, the width of the silicon nitride stripe over the emitter region is made sufficiently wide to prevent the punchthrough oxide from forming, thereby retaining the thin pad oxide which was previously grown over the emitter region. The silicon nitride mask is then removed by wet etching to provide a self-aligned oxide implant mask having different thicknesses over the collector, base, and emitter regions, and also different thicknesses over the source and gate/drain regions of the FET. A first photoresist implant block-out mask is used to protect the FET device areas from implant while a series of consecutive ion implants is carried out to form the collector, base, and emitter for the bipolar transistors. This eliminates the need for a series of separate photoresist implant masks that is required in the prior art. However, if only one type of device (bipolar or FET) is desired, the photoresist implant block-out masks are not required and the process complexity is reduced.

The collector ion implant energy is sufficient to provide a projected range $R_p(C)$ that is greater than the oxide implant mask over the collector regions so as to form a collector contact in the silicon substrate surface while forming a buried collector under the base and the emitter regions in the substrate because of the thinner oxide mask over the base and emitter regions. The base is implanted next through the thinner oxide implant mask over the base regions with a projected range $R_p(B)$ sufficient to form the base contact region, while the thicker implant mask over the collector blocks the implant, and the thinner pad oxide over the emitter region results in a buried base. The emitter is then implanted through the thin pad oxide into the silicon substrate over the buried base, while the thicker implant oxides elsewhere on the substrate and the first photoresist block-out mask protect the substrate and FET areas from implantation.

The FETs are formed next by stripping the first photoresist implant block-out mask, and by using a second photoresist implant block-out mask to protect the completed bipolar transistors. The pad oxide on the FET device areas is removed, for example, by wet etching. Then shield regions are formed in the FET source regions by diffusion or ion implantation, while the relatively thick self-aligned punchthrough oxide implant mask over the FET gate/drain areas and the thicker field oxide prevent implanting in the silicon elsewhere on the substrate. The self-aligned source shield region provides higher driver currents and higher breakdown voltages between the FET source and drain. The punchthrough oxide implant mask is etched to expose the gate/drain areas, the second photoresist block-out mask is then stripped, and an FET gate oxide is formed. An N$^+$ doped polysilicon layer is deposited and patterned to form the FET gate electrodes on the gate oxide. A conformal insulating layer, such as a CVD silicon oxide, is deposited and anisotropically plasma etched back to form sidewall spacers on the FET gate electrodes. N$^+$ doped source/drain regions are implanted adjacent to the FET gate electrodes, thereby completing the FETs for making BiFET and BiCMOS circuits in conjunction with the previously completed bipolar transistors. The FET source/drain implant can also be used to form the emitter on the bipolar device provided that the circuit requirements allow the emitter junction depth to be the same as the source/drain junction depth, thereby eliminating the emitter implant step.

To form larger devices an array of closely spaced silicon nitride stripes of varying widths and spacings can be used to make both bipolar transistors and FETs using essentially the above method. The widths of the nitride stripes and spacings therebetween are selected to provide a LOCOS punchthrough oxide thickness under the nitride stripes that is about equal to the thickness of the field oxide thinning that occurs in the spaces. This allows for the fabrication of transistors having various sizes, depending on the BiCMOS or BiFET requirements.

BRIEF DESCRIPTION OF THE DRAWINGS

The objects and other advantages of the invention will become more apparent in the preferred embodiments when read in conjunction with the following drawings.

DESCRIPTION OF THE PREFERRED EMBODIMENTS

Prior to discussing the method of this invention for making self-aligned implanted bipolar and field effect transistors on a silicon substrate, a brief description of the oxidation characteristics of the LOCOS method for closely spaced nitride stripes will be helpful in setting the invention in perspective. Many of the MOS technologies apply isolation techniques based on a LOcal Oxidation of Silicon (LOCOS). In this conventional method, a patterned silicon nitride layer is used to mask device areas on a silicon substrate from oxidation. Then the substrate is thermally oxidized to form the Field OXide (FOX) that surrounds and electrically isolates the device areas. The thickness of the FOX and the thickness of the oxide formed under the narrow silicon nitride mask by lateral oxidation (commonly referred to as the punchthrough oxide) are a function of the widths and spacings of the silicon nitride mask. In the conventional LOCOS the silicon nitride mask is sufficiently wide to prevent punchthrough oxide from forming. However, in this invention, a novel LOCOS method is used to make narrow silicon nitride stripes of various widths for making self-aligned bipolar and field effect transistors.

It should also be well understood by those skilled in the art that other device structures can be formed. For example, the process is described for making BiFET or BiCMOS devices, but that either device can be made by omitting the photoresist block-out mask in the following description. Further, by including N- and P-wells in the substrate and forming P-channel and N-channel FETs by this method, Complementary Metal Oxide Semiconductor (CMOS) devices can be made and Bipolar/CMOS (BiCMOS) circuits can be formed therefrom. Further, other semiconductor devices can also be made that take advantage of this LOCOS method for forming self-aligned implants. Also, it should be well understood by those skilled in the art that these novel LOCOS self-aligned implant masks can be used to make other types of semiconductor devices.

Figure 1:
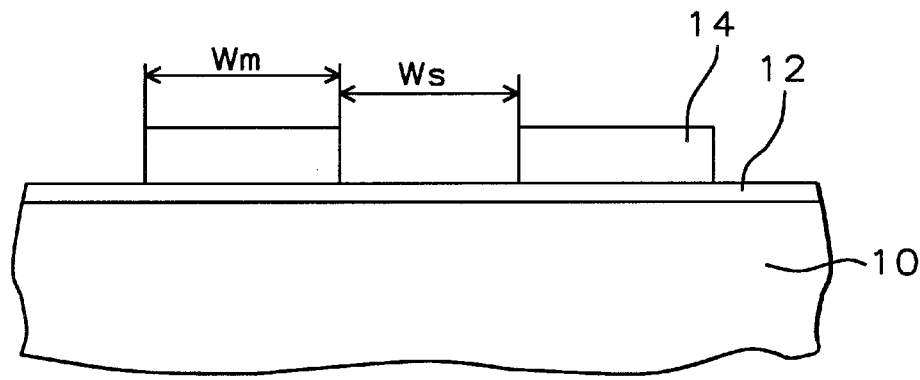
FIGS. 1 and 2 show respective schematic cross-sectional views of a simple LOCOS structure before and after the field oxidation to better understand the oxidation characteristics of LOCOS with relation to the method of this invention for making self-aligned bipolar and field effect transistors.
Figure 2:
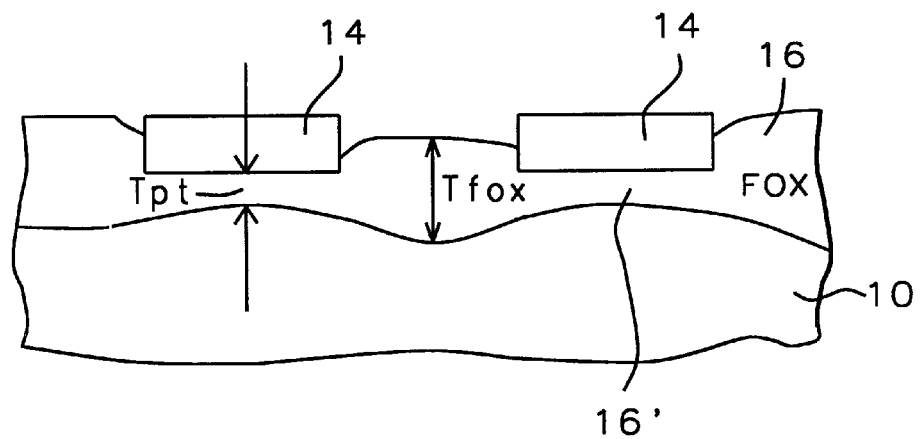
Figure 3:
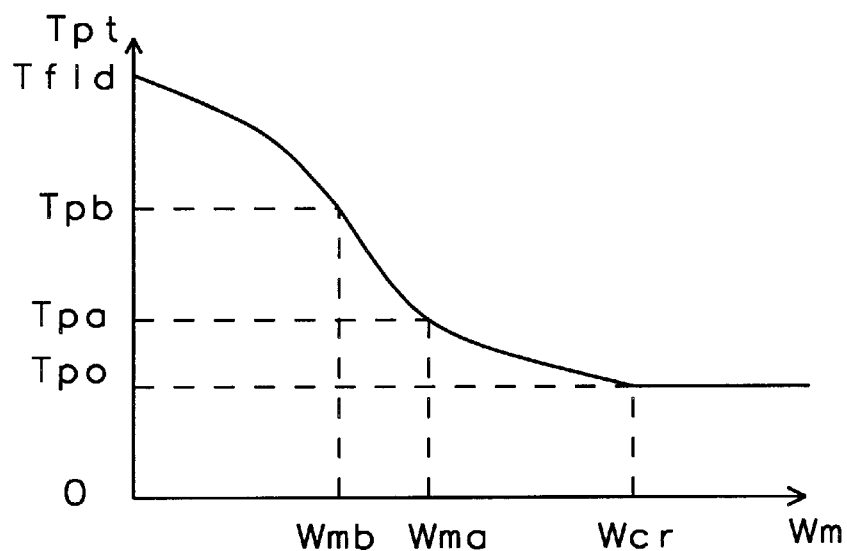
FIG. 3 shows a graph of the increase in the punchthrough oxide thickness $T_{pt}$ under the silicon nitride mask as a function of decreasing mask width ($W_m$) during thermal oxidation.
Figure 4:
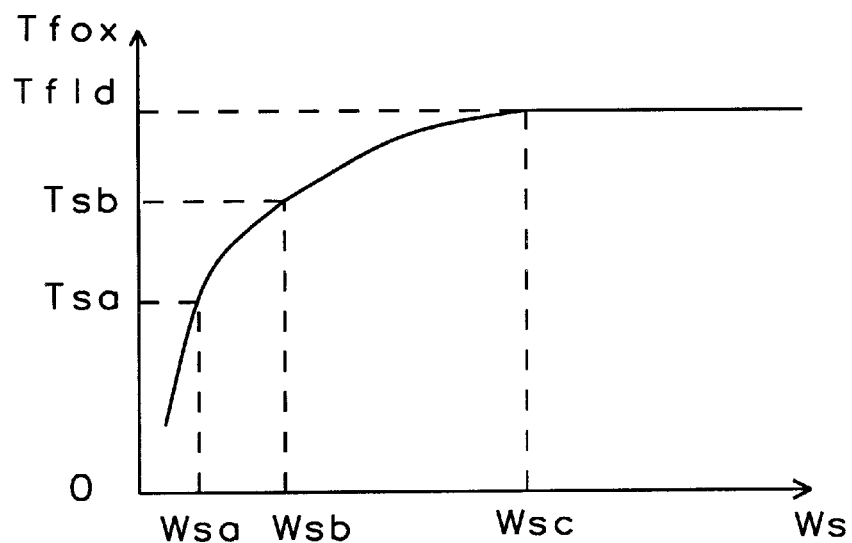
FIG. 4 shows a graph of the decrease (thinning) in the field oxide thickness $T_{fox}$ as a function of decreasing spacing ($W_s$) between adjacent silicon nitride stripes.

More specifically, as shown in FIG. 1, the LOCOS is formed by first thermally oxidizing the silicon substrate 10 to form a stress-release pad oxide 12. The thickness of the pad oxide is typically between about 100 and 600 Angstroms. A silicon nitride ($Si_3N_4$) layer 14 is deposited to serve as a barrier to oxidation. For example, layer 14 can be deposited by chemical vapor deposition (CVD) to a thickness of between about 1000 and 2000 Angstroms. Silicon nitride layer 14 is then patterned to form an oxidation barrier mask 14, for example having a silicon nitride width $W_m$, and the spacings of the openings between the patterned nitride having a width $W_s$. The substrate 10 is then thermally oxidized to form the field oxide 16, as shown in FIG. 2, while concurrently lateral oxidation forms a punchthrough oxide 16' under the nitride mask 14. During the thermal oxidation, the thickness $T_{pt}$ of the punchthrough oxide 16' at the center of the mask depends on the width $W_m$ of the nitride mask 14. The dependence of $T_{pt}$ on $W_m$ is shown qualitatively in the graph in FIG. 3 ($T_{pt}$ vs. $W_m$), while the thickness $T_{fox}$ of the local field oxide (FOX) depends on the widths $W_s$ (less than about 0.4 um) of the spacings of the openings in the patterned nitride layer 14, as shown in the graph in FIG. 4 ($T_{fox}$ vs. $W_s$). These thicknesses are also dependent on the pad oxide thickness, the nitride thickness, and other oxidation parameters. Usually the critical width $W_{cr}$ (FIG. 3), where the punchthrough oxide thickness is strongly dependent on $W_m$, is at values less than about 0.35 to 0.45 micrometers. On the other hand, the thinning of the local FOX in the openings is strongly dependent on the spacing $W_s$, when $W_s$ is less than $W_{sc}$ of about 0.4 um, as depicted in FIG. 4. In the prior art, the width of the silicon nitride mask 14 is maintained above the critical width $W_{cr}$ to prevent the punchthrough oxide from forming, and the width $W_s$ is maintained above the critical width $W_{sc}$ of the spacing to prevent thinning of the FOX.

Figure 5:
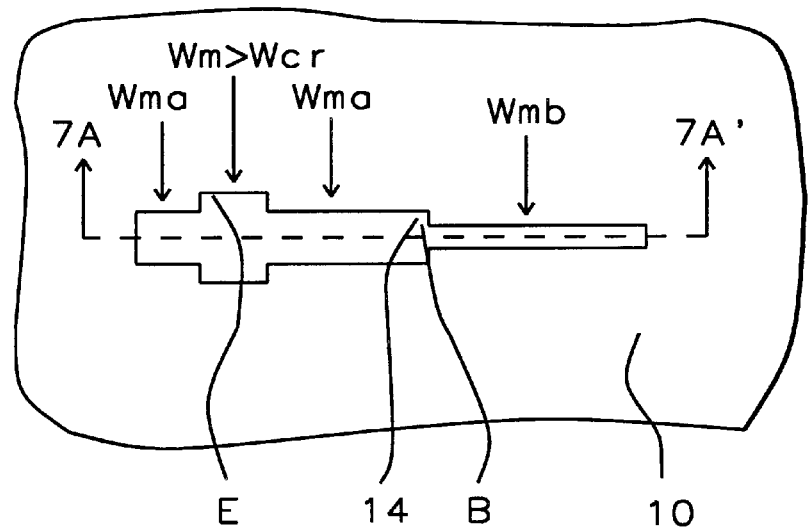
FIG. 5 shows a schematic top view of a silicon nitride mask for a bipolar transistor comprised of a single stripe having various widths.

Referring now to FIG. 5, by a first embodiment, a schematic top view is shown of a single-stripe silicon nitride mask 14 of varying width on an active device region on a P$^-$ silicon substrate 10 for making a submicrometer bipolar transistor. The width of nitride layer 14 over the collector region C for the bipolar transistor is $W_{mb}$ and is less than the critical width $W_{cr}$, as determined from the graph shown in FIG. 3. Also as shown in FIG. 3, after LOCOS the punchthrough oxide thickness $T_{pt}$ grows to a thickness $T_{pb}$ under the mask having width $W_{mb}$. Likewise, the width of layer 14 over the base region B is $W_{ma}$, where $W_{ma}$ is wider than $W_{mb}$, and after LOCOS the punchthrough oxide grows to a thickness $T_{pa}$ which is thinner than $T_{pb}$. The width of layer 14 over the emitter region E is $W_m > W_{cr}$, and therefore the punchthrough oxide does not form completely under the mask and the pad oxide having a thickness $T_{po}$ is retained, as determined from the graph shown in FIG. 3. This bipolar mask structure after thermal oxidation (LOCOS) results in an excellent self-aligned multiple thickness silicon oxide implant mask for fabricating submicrometer bipolar transistors, and is explained later in more detail.

Figure 6:
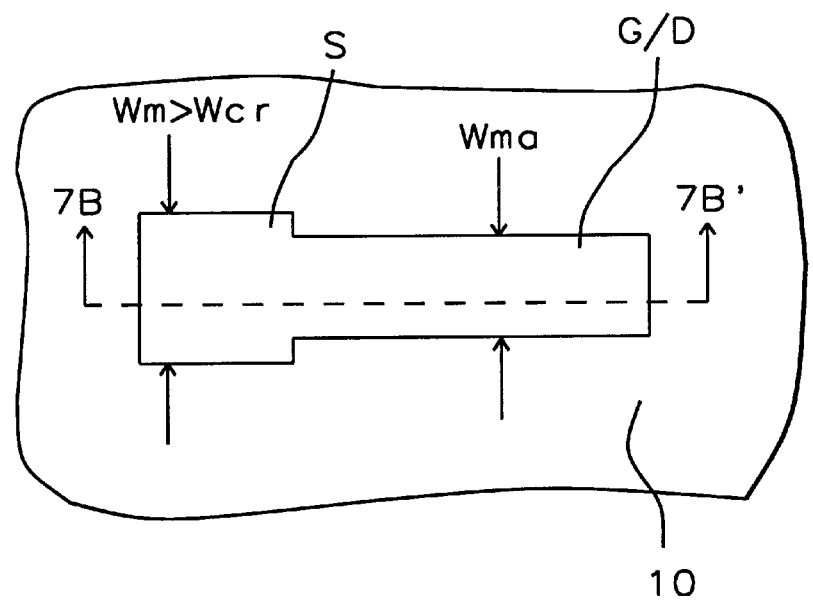
FIG. 6 shows a schematic top view of a silicon nitride mask for making an FET comprised of a single stripe having various widths.

Referring now to FIG. 6, the $Si_3N_4$ mask 14 is also patterned to form a single stripe over the active device regions for the P-channel FET. The $Si_3N_4$ mask is patterned to have a nitride width $W_{ma}$ over the gate/drain region G/D for the FET, which, after thermal oxidation (LOCOS), forms a punchthrough oxide having a thickness $T_{pa}$, as determined from the graph in FIG. 3. And the width of the silicon nitride mask $W_m$ over the source region S for the FET is wider than the critical width $W_{cr}$, thereby retaining the thin pad oxide 12 having a thickness $T_{po}$ over the source region, also determined from the graph in FIG. 3. The thin pad oxide over the source region allows for an FET source shield implant, while the thicker punchthrough oxide protects the G/D from implantation, as will become clear later.

To achieve separate field oxide thicknesses $T_{fox}$ for the bipolar and the FET, the nitride mask can be patterned for the bipolar and the FOX for the bipolar can be partially grown, and then the silicon nitride layer 14 can be further patterned for the FET field oxide, and the thermal oxidation completed to form a thicker FOX for the bipolar and a thinner FOX for the FET.

Referring now to FIGS. 7A–9A and FIGS. 7B–9B, the resultant cross-sectional views of the LOCOS self-aligned implant mask are shown after removing the silicon nitride mask, and one sequence of process steps for forming the bipolar and FET is described.

Figure 7A:
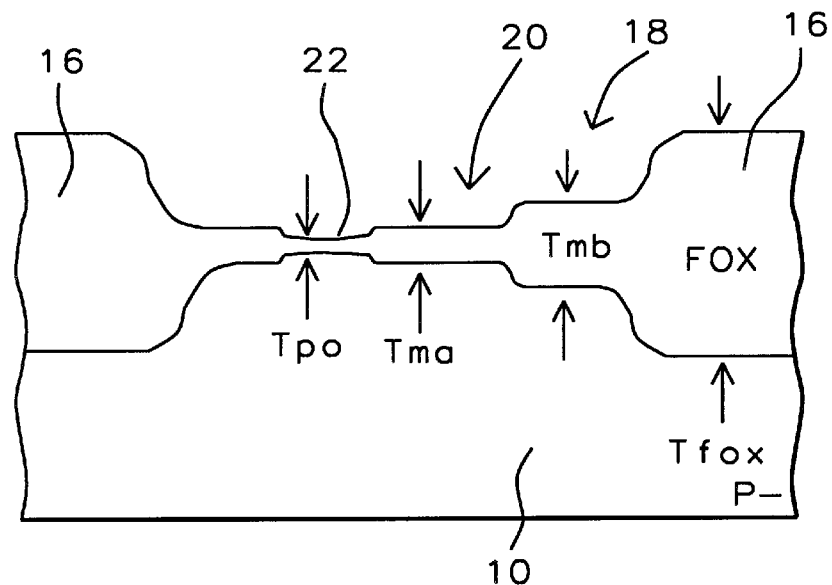
FIGS. 7A and 7B show, respectively, a schematic cross-sectional view of the oxide implant mask formed from the punchthrough oxide for the bipolar transistor prior to implanting the collector, base, and emitter, and a schematic cross-sectional view of the oxide implant mask formed from the punchthrough oxide for the FET that is formed concurrently with the formation of the implant mask for the bipolar.
Figure 7B:
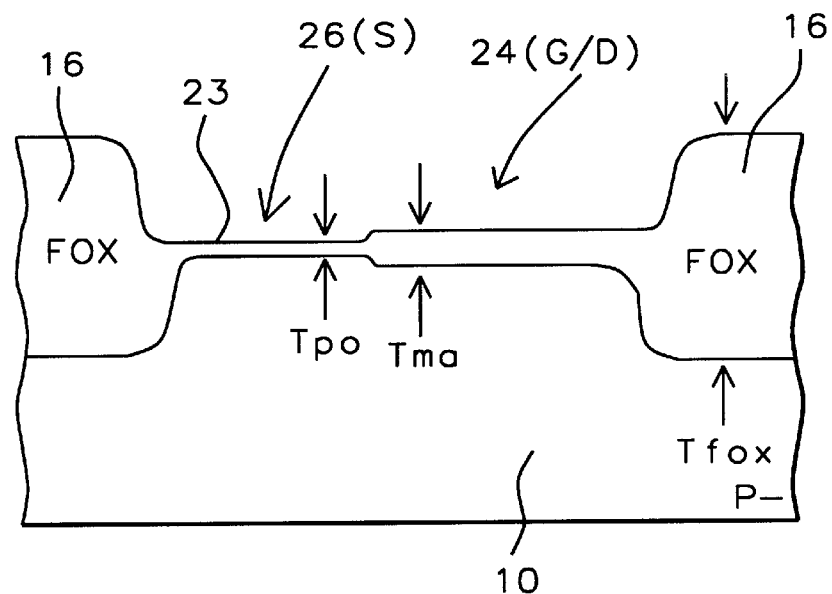

Referring to FIG. 7A, a schematic cross-sectional view is shown for the region through 7A–7A' of FIG. 5 for the bipolar transistor region, after growing the oxide by LOCOS and after removing the silicon nitride mask 14, while FIG. 7B is a schematic cross-sectional view for the FET region through 7B–7B' in FIG. 6, also after the oxide is grown by LOCOS and after removing the nitride mask 14. The silicon nitride mask 14 can be selectively removed by using a hot phosphoric acid etch. Continuing, and as shown in FIG. 7A, the thermal oxidation (LOCOS) results in a novel self-aligned implant mask having, respectively, thickness $T_{fld} > T_{mb} > T_{ma} > T_{po}$ for the field oxide (FOX) 16, collector contact region 18, the base region 20, and the emitter region 22. By way of example only, when the field oxide 16 is grown to a thickness $T_{fld}$ of between about 8000 and 10000 Angstroms, the corresponding LOCOS oxidation parameters are selected to grow an oxide implant mask over the collector contact region 18 to a thickness $T_{mb}$ of between about 3800 and 4500 Angstroms, and an oxide implant mask over the base region 20 to a thickness $T_{ma}$ of between about 1800 and 2200 Angstroms, and retaining a pad oxide thickness $T_{po}$ over the emitter region 22 of between about 150 and 300 Angstroms.

Referring now to FIG. 7B, the oxide mask profile for the FET device area is shown for the cross section 7B–7B' in FIG. 6, after the thermal oxidation (LOCOS) and the nitride removal. The thermal oxidation (LOCOS) results in a self-aligned oxide implant mask having, respectively, thicknesses of $T_{fld}>T_{ma}>T_{po}$ for the field oxide (FOX) 16, gate/drain region 24 (G/D), and the source region (S) 26, respectively.

By way of example only, when the field oxide 16 is grown to a thickness $T_{fld}$ of between about 3500 and 4000 Angstroms, the corresponding LOCOS grows an oxide implant mask 30 (used as an implant block-out mask) to a thickness $T_{ma}$ of between about 1500 and 2000 Angstroms over the gate/drain region 24 (G/D), and retains the pad oxide 23 over the source region 26 with a thickness $T_{po}$ of between about 150 and 200 Angstroms.

Figure 8A:
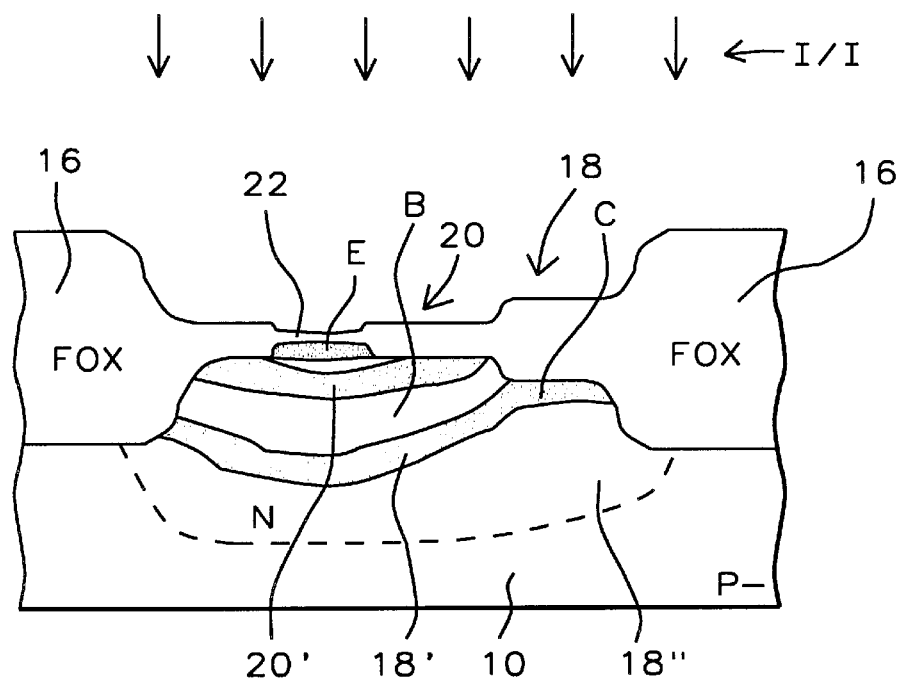
FIGS. 8A and 8B show, respectively, a cross-sectional view of a bipolar transistor after implanting the collector, base, and emitter through the oxide implant mask, and a cross-sectional view of the FET area having a first photoresist block-out mask that protects the FET from the bipolar implants.
Figure 8B:
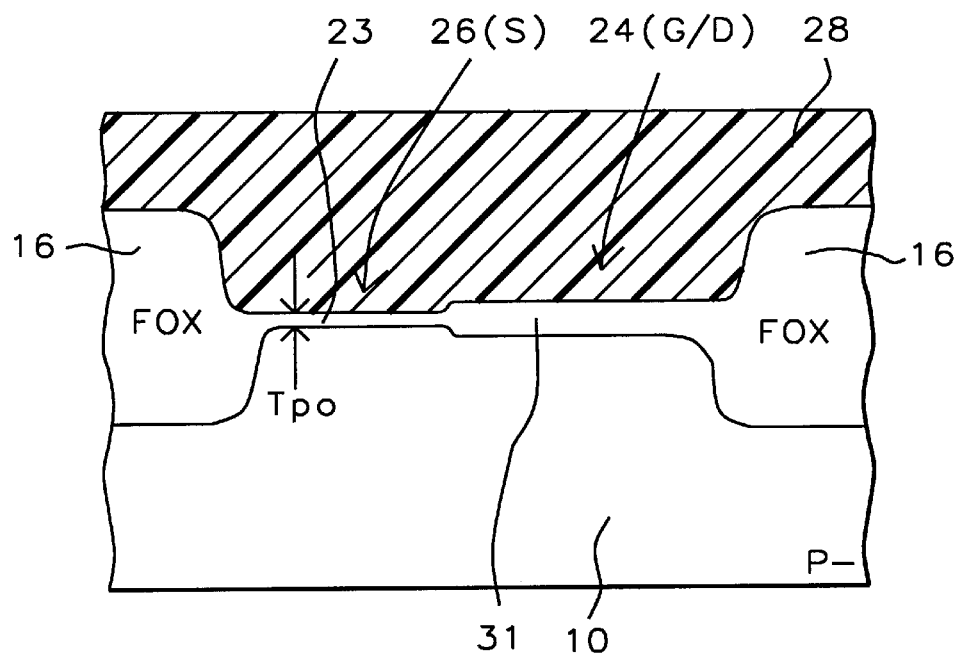

Referring now to FIGS. 8A and 8B, the ion implant sequence is described for forming the bipolar transistor shown in FIG. 8A, while a first photoresist mask 28 is formed over and protects the FET device area (FIG. 8B) from the bipolar implant.

However, it should be understood that by providing the desired mask set for making only bipolar or only FET devices, one can make either bipolar or FETs separately on the substrate 10. In this case, the photoresist ion implant block-out masks are not necessary, and the FOX can be grown to different thicknesses, as given in the examples above.

Referring now to FIG. 8A, the collector C, base B, and emitter E are ion implanted (I/I) through the self-aligned oxide mask without the need for separate photoresist implant masks. (The ion implantation is indicated by the vertical arrows labeled I/I.) This ion implantation without additional masking reduces significantly the number of additional processing steps, and provides a self-aligned submicrometer bipolar transistor for BiFET ULSI applications. For the npn bipolar, the collector implant is preferably at an ion energy to provide a projected range $R_p$ satisfying the condition $T_{fld}>R_p>T_{mb}$, thereby forming a collector C having a collector contact area 18', while forming a buried collector C under the base B and emitter E having a thinner oxide mask ($T_{ma}$ and $T_{po}$) as depicted in FIG. 8A. Likewise, the base implant energy is selected to have a projected range $R_p$ satisfying the condition that $T_{mb}>R_p>T_{ma}$. This results in a base B contact area 20' under the base mask region 20 and a buried base B under the emitter E region 22. Finally, the emitter E 22' is implanted under the pad oxide 23 having $R_p$, where $T_{ma}>R_p>T_{po}$.

By way of example only, for the range of implant oxide mask thicknesses cited above, the preferred collector implant would be a phosphorus ($p^{31}$) implant with an ion implant energy of between about 320 and 600 KeV and an implant dose of between 1.0 E 13 and 1.0 E 14 ions/cm². The base implant is preferably boron ($B^{11}$) ions having an ion implant energy of 60 to 120 Kev and an implant dose of between 3.0 E 12 and 7.0 E 12 ions/cm². The emitter implant is preferably arsenic ($As^{75}$) ions with an ion implant energy of 50 to 150 KeV and a dose of between 3.0 E 15 and 7.0 E 15 ions/cm². This completes the bipolar transistor. In addition, a deep, buried N doped implanted region 18" can be used to reduce collector-to-substrate capacitance and to reduce collector resistance.

Figure 9A:
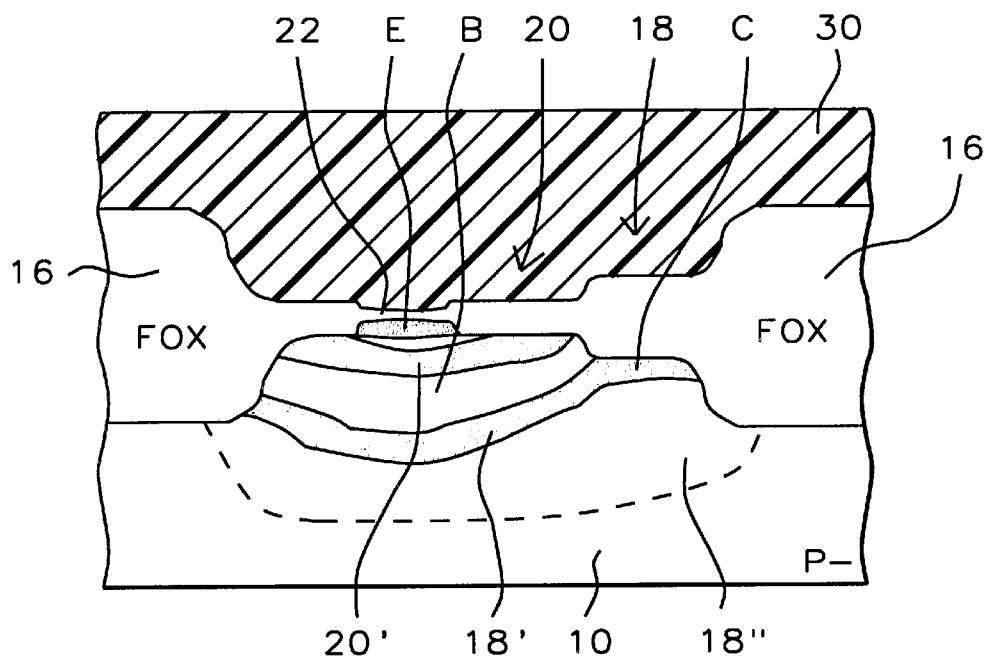
FIGS. 9A and FIG. 9B show, respectively, a schematic cross-sectional view of the bipolar device area with a second photoresist block-out mask that protects the bipolar during fabrication of the FET, and a cross-sectional view of the completed FET structure.
Figure 9B:
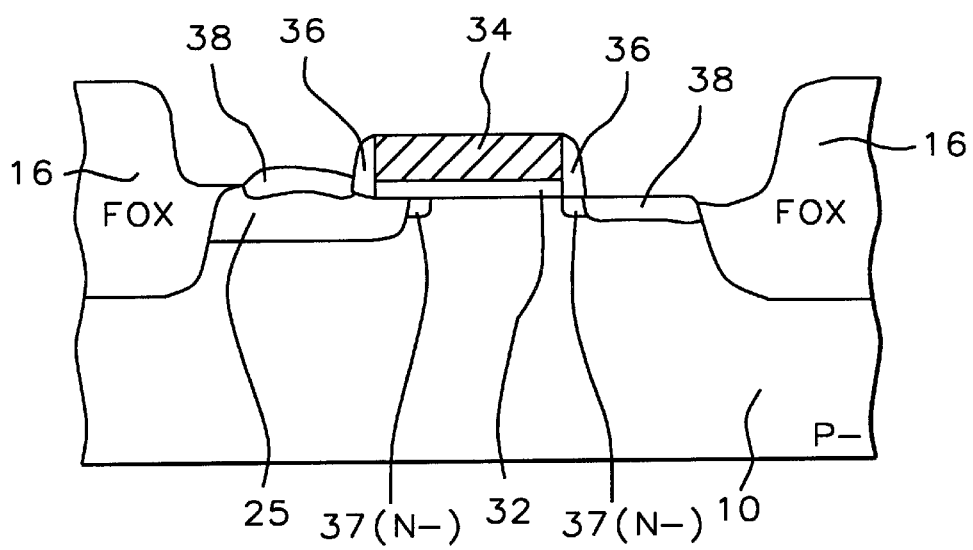

Referring to FIGS. 9A and 9B, the first photoresist block-out mask 28 is stripped, and a second photoresist block-out mask 30 is used over the completed bipolar device area, as shown in FIG. 9A, while the FET is formed as shown in FIG. 9B. Now, as shown in FIG. 9B, a boron ($B^{11}$) ion implant having a $R_p$ satisfying the condition $T_{ma}>R_p>T_{po}$ is used to implant a shield region 25 in the source S region 26. The pad oxide 23 and the oxide mask 31 over the gate/drain region 24 (shown in FIG. 8B) are removed by etching in a buffered oxide etch (BOE), or by using a high selectivity oxide-to-silicon plasma etch in an etchant gas such as trifluoromethane ($CHF_3$) and argon (Ar). The second photoresist mask 30 (FIG. 9A) is stripped, and a gate oxide 32, having a thickness of between about 60 and 250 Angstroms, is grown on the gate/drain region 24 of the FET. The gate electrode 34 for the N-channel FET is then formed by depositing, doping, and patterning a polysilicon layer having a thickness of between about 2000 and 3000 Angstroms, and a phosphorus implant dose of between about 1.0 E 15 and 5.0 E 15 atoms/cm³ is used to form the lightly doped source/drain areas 37($N^-$), for example, using phosphorus ($p^{31}$) Sidewall spacers 36 are formed next by depositing a conformal insulating layer, such as $SiO_2$, which is anisotropically plasma etched back to provide sidewall spacers having a width of between about 0.1 and 0.2 micrometers (um). Arsenic ($As^{75}$) ions are implanted in the source/drain areas 38 to a dose of between about 3.0 E 15 and 7.0 E 15 ions/cm² to complete the FET. Further processing is used to interconnect the bipolar and field effect transistors to form BiFET circuits.

Referring now to FIGS. 10 through 14, by the method of a second embodiment, an array of silicon nitride stripes are used to make larger bipolar transistors and larger FETs of varying sizes, such as bipolar power transistors and the like. It should also be noted that these transistors can be formed concurrently on the same substrate and at the same time as the transistors formed from a single nitride stripe. Also, except for the different layout design of the silicon nitride stripes, the process is identical to the process for the single-stripe transistors, and therefore the process details are not further described. Only the design layout for the $Si_3N_4$ mask having an array of stripes is described in detail.

To achieve these larger transistors, an array of silicon nitride stripes having well defined widths $W_m$ and spacings $W_s$ are formed for self-aligned bipolars and FETs, which can also be used in BiFET circuits.

Figure 10:
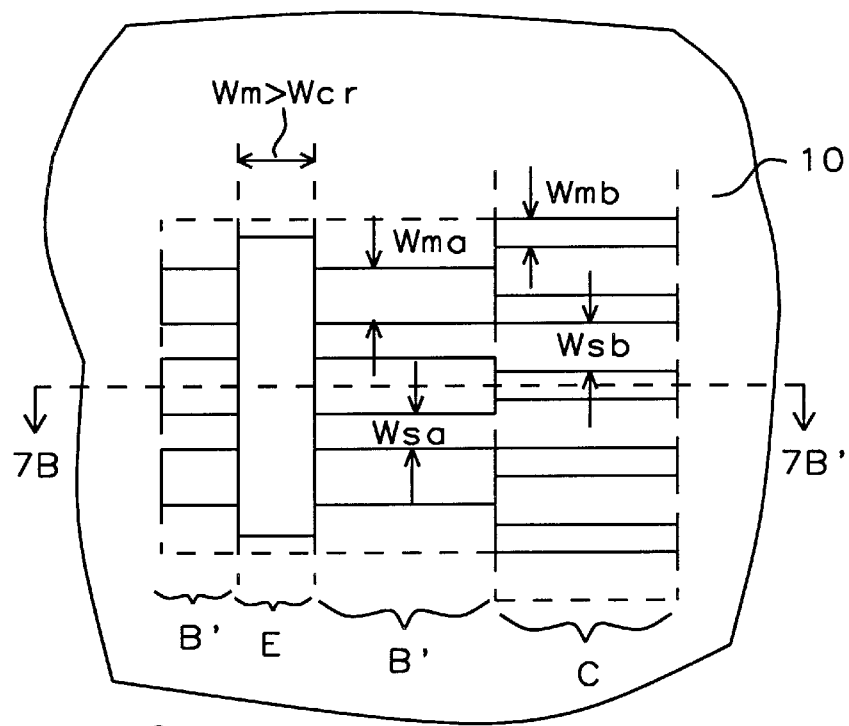
FIGS. 10 through 12 show schematic top views of various silicon nitride masks for making bipolar transistors comprised of arrays of stripes having various widths and spacings for making transistors having larger sizes than the transistors made using a single stripe.
Figure 11:
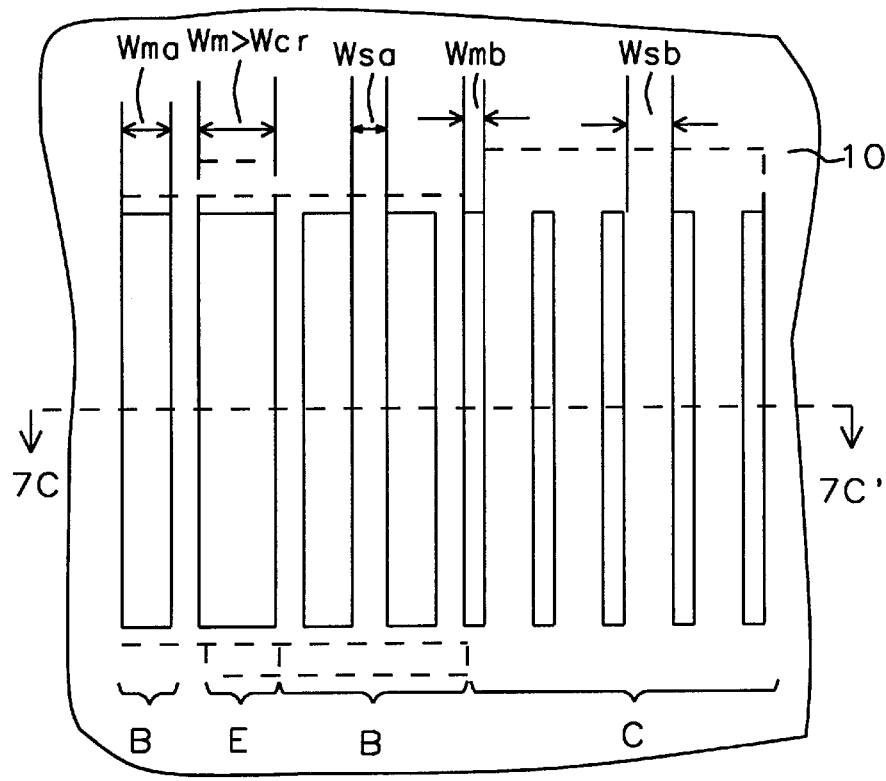
Figure 12:
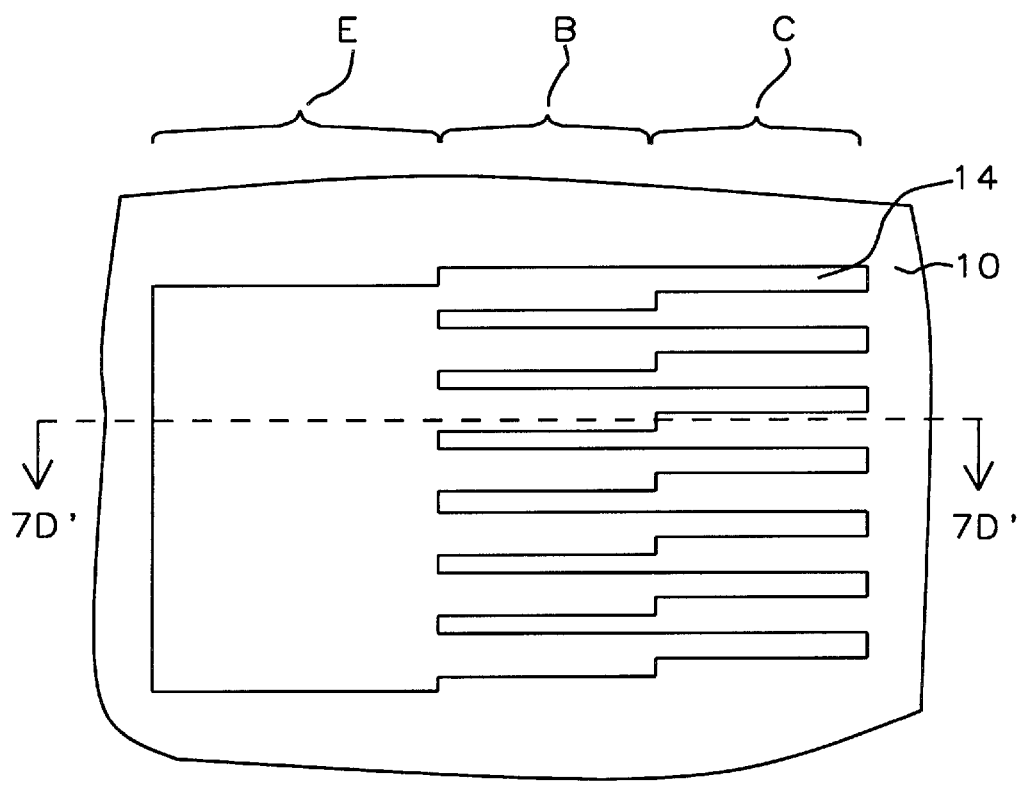

Referring now more specifically to FIGS. 10 through 12 for making the bipolar transistor, three different arrays of silicon nitride stripes 14 are shown. In each of the three arrays the width $W_m$ of the nitride stripe over the collector region C is $W_{mb}$, and the spacing is $W_{sb}$. The width $W_{mb}$ of the stripes and the spacing $W_{sb}$ are selected for the punch-through thickness $T_{pt}$ vs. $W_m$ (FIG. 3) and the field oxide thickness $T_{fox}$ vs. $W_s$ (FIG. 4) so that the thickness $T_{pb}$ and a local field oxide having a thickness $T_{sb}$ between the $Si_3N_4$ stripes are about the same thickness ($T_{mb}=T_{sb}$) after the LOCOS thermal oxidation is carried out. The width $W_{ma}$ of the stripes and the spacings $w_{sa}$ over the base region B are selected to provide, respectively, a punchthrough oxide thickness of $T_{pa}$ and a thinner field oxide $T_{sa}$ between the $Si_3N_4$ stripes that are about the same thickness ($T_{pa}=T_{ma}$), also determined from the graphs in FIGS. 3 and 4. The width $W_m$ of the $Si_3N_4$ stripe over the emitter region E is made greater than the critical width $W_{cr}$ to retain the pad oxide $T_{po}$, as determined from the graph in FIG. 3. These silicon nitride masks, after LOCOS, provide an essentially constant thickness punchthrough oxide implant mask of different thicknesses over the collector, base, and emitter, thereby forming a self-aligned implant mask for the large bipolar transistors. In the regions between the bipolar device areas formed by the array of nitride stripes, a spacing greater than the critical spacing $W_{sc}$ is provided to maintain a field oxide with a maximum thickness $T_{fld}$, as determined from the graph in FIG. 4. The cross sections through region 7B–7B' of FIG. 10, through region 7C–7C' of FIG. 11, and through region 7D–7D' of FIG. 12 are similar to the cross section shown in FIG. 7A for the oxide implant mask formed using a single silicon nitride stripe.

Figure 13:
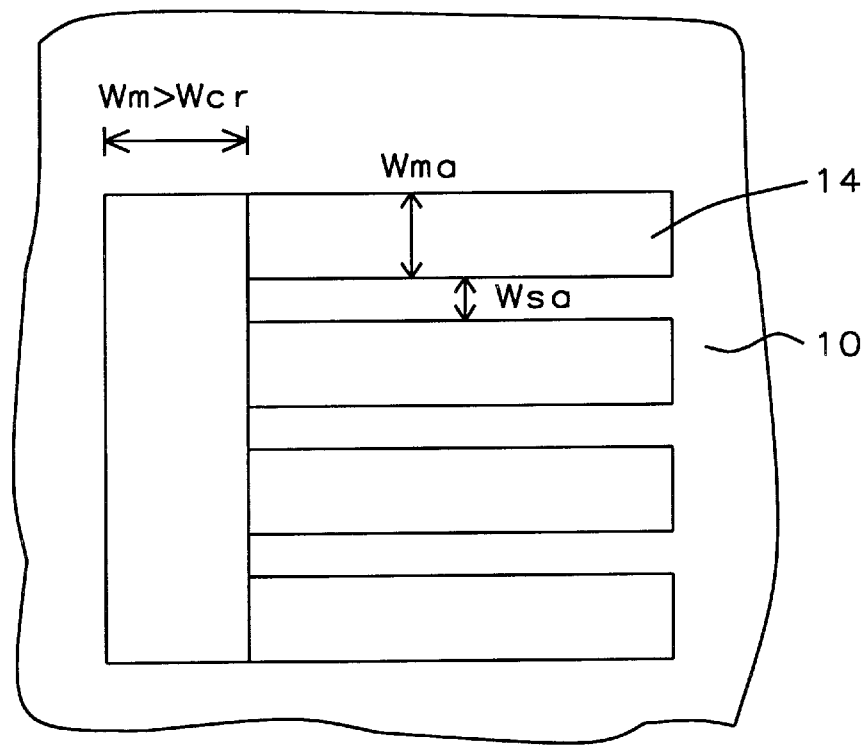
FIGS. 13 and 14 show schematic top views of a silicon nitride mask for making FETs comprised of various arrays of stripes having various widths and spacings for making transistors larger in size than the transistors made using a single stripe.
Figure 14:
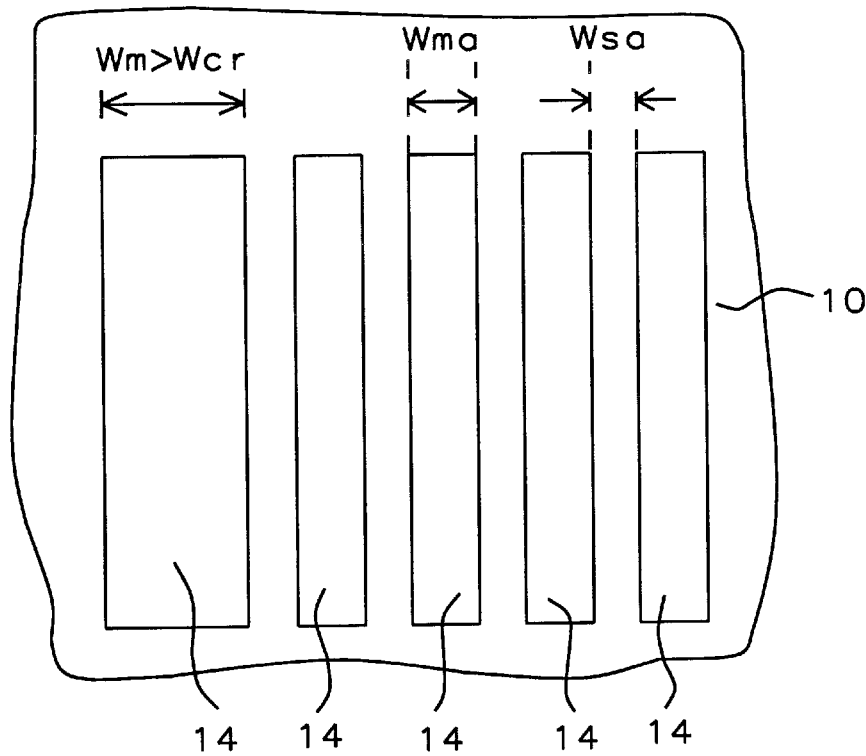

Referring now to FIGS. 13 and 14, schematic top views are shown for making larger P-channel FETs using two different arrays of silicon nitride stripes 14. The $Si_3N_4$ mask 14 is patterned over the device areas for the larger FETs having widths $W_{ma}$ and spacings $W_{sa}$, respectively, over the gate/drain region during the LOCOS to provide a punchthrough oxide thickness $T_{pa}$ and a field oxide thinning of $T_{sa}$ that are about equal in thickness, as determined from the graphs in FIGS. 3 and 4. The width of the silicon nitride mask $W_m$ over the source region is greater than $W_{cr}$ to retain the pad oxide $T_{po}$ (FIG. 3). The nitride stripes can be formed for the larger FETs at the same time that the nitride layer 14 is patterned for the bipolar transistors.

This novel LOCOS method reduces the number of photoresist masking steps for forming the emitter, base, and collector for the bipolar transistors. The method is also compatible with the conventional technology, and particularly with a CMOS process. BiCMOS devices can now be manufactured in which all active regions of the bipolar and MOS devices are formed simultaneously without thermal budget increase. Further, the emitter, base, and collector for the bipolar are self-aligned. The collector implant energy can be adjusted so that the implanted collector contact is at the silicon substrate surface to minimize the collector resistance at the collector contact. Since the punchthrough oxide around the emitter region is partially recessed into the substrate by virtue of the thermal oxidation, the base current is reduced, and the base transport factor (gain) of the bipolar transistor is improved.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a bipolar transistor having self-aligned emitter, base, and collector on a semiconductor substrate using a single implant mask comprising the steps of:

forming a silicon oxide layer on a principal surface of a silicon substrate thereby forming a pad oxide layer;

depositing a silicon nitride layer on said pad oxide layer thereby providing an oxidation barrier layer;

patterning said silicon nitride layer and forming silicon nitride stripes over a device area having respective decreasing widths for emitter, base, and collector regions for said bipolar transistor;

thermally oxidizing said silicon substrate and forming a field oxide isolation around said device area having said silicon nitride stripes; and concurrently by the same oxidation, laterally oxidizing said substrate under said silicon nitride stripes to form a punchthrough oxide having a thickness that varies inversely as a function of the width of said silicon nitride stripes and provides a self-aligned oxide implant mask for said bipolar transistor, and where said oxide implant mask over said collector is thinner than said field oxide isolation, said oxide implant mask over said base is thinner than said oxide implant mask over said collector, and said pad oxide over said emitter is thinner than said oxide implant mask over said base, where the width of said silicon nitride stripe for said emitter region is sufficiently wide to prevent said punchthrough oxide from forming, thereby retaining said pad oxide over said emitter region;

wet etching and removing said silicon nitride layer;

ion implanting consecutively said collector, base, and emitter for said bipolar transistor through said punchthrough oxide implant mask having self-aligned variable thicknesses, wherein the ion energy for said implanting of said collector is sufficient to pass through said oxide implant mask over said collector region into said silicon substrate and concurrently to form a buried collector under said base and said emitter regions in said substrate, and the ion energy for said implanting of said base is sufficient to pass through said oxide implant mask over said base region and to form a buried base under said emitter region, and further said emitter is implanted through said pad oxide into said silicon substrate over said buried base, thereby completing said bipolar transistor.

2. The method of claim 1, wherein said pad oxide layer is formed by thermal oxidation to a thickness of between about 150 and 600 Angstroms.

3. The method of claim 1, wherein said silicon nitride layer is deposited by chemical vapor deposition to a thickness of between about 1000 and 2000 Angstroms.

4. The method of claim 1, wherein said field oxide isolation is formed by thermal oxidation and grown to a thickness of between about 4000 and 15000 Angstroms.

5. The method of claim 1, wherein said silicon nitride stripe over said collector region is between about 0.3 and 0.5 micrometers (um) wide, and during formation of said field oxide isolation said punchthrough oxide over said collector region is grown to a thickness of between about 3500 and 4500 um.

6. The method of claim 1, wherein said silicon nitride stripe over said base region is between about 0.2 and 0.4 micrometers (um) wide, and during formation of said field oxide isolation said punchthrough oxide over said base region is grown to a thickness of between about 1500 and 2500 Angstroms.

7. The method of claim 1, wherein said silicon nitride stripe over said emitter region is at least greater than about 0.5 micrometers (um) wide to prevent said punchthrough oxide from completely forming and thereby retaining said pad oxide on said emitter region.

* * * * *